US008049529B2

(12) United States Patent
Fulcomer

(10) Patent No.: US 8,049,529 B2
(45) Date of Patent: Nov. 1, 2011

(54) FAULT TRIGGERRED AUTOMATIC REDUNDANCY SCRUBBER

(75) Inventor: James L. Fulcomer, El Segundo, CA (US)

(73) Assignee: Raytheon Company, Waltham, MA (US)

( * ) Notice: Subject to any disclaimer, the term of this patent is extended or adjusted under 35 U.S.C. 154(b) by 193 days.

(21) Appl. No.: 12/220,959

(22) Filed: Jul. 30, 2008

(65) Prior Publication Data
US 2010/0026338 A1    Feb. 4, 2010

(51) Int. Cl.
*H03K 19/003* (2006.01)
*H03K 19/00* (2006.01)
*H03K 3/02* (2006.01)

(52) U.S. Cl. ............................. 326/11; 326/94; 327/198

(58) Field of Classification Search ................ 326/9–11, 326/93, 95, 98; 327/144, 197–200; 365/156, 365/189.05, 194
See application file for complete search history.

(56) References Cited

U.S. PATENT DOCUMENTS

| 4,375,683 | A  | * | 3/1983 | Wensley ...................... 714/12 |
| 4,967,347 | A  | * | 10/1990 | Smith et al. ..................... 714/12 |
| 6,504,410 | B2 | * | 1/2003 | Waldie et al. .................. 327/199 |
| 6,504,411 | B2 | * | 1/2003 | Cartagena ..................... 327/199 |
| 7,318,175 | B2 | * | 1/2008 | Lee ................................ 714/42 |
| 7,590,907 | B2 | * | 9/2009 | Drake et al. .................. 714/726 |
| 2005/0168257 | A1 | * | 8/2005 | Cabanas-Holmen et al. 327/199 |

* cited by examiner

*Primary Examiner* — Shawki S Ismail
*Assistant Examiner* — Dylan White
(74) *Attorney, Agent, or Firm* — Pillsbury Winthrop Shaw Pittman LLP

(57) ABSTRACT

A redundancy scrubber. The novel scrubber includes fault detection logic for detecting if a circuit has been upset and a mechanism for automatically rewriting data to the circuit when an upset is detected. In an illustrative embodiment, the scrubber corrects for upsets in a circuit comprised of a plurality of redundant circuits, each redundant circuit including a data port for receiving data and a load enable port for controlling when the redundant circuit should load new data. The fault detection logic processes the outputs from each of the redundant circuits and outputs a fault detect signal indicating whether an upset has been detected in one or more of the redundant circuits. The fault detect signal is coupled to the load enable ports, forcing the redundant circuits to immediately reload with corrected data from a voter or with new incoming data when an upset is detected.

18 Claims, 2 Drawing Sheets

FAULT TRIGGERRED AUTOMATIC REDUNDANCY SCRUBBER

BACKGROUND OF THE INVENTION

1. Field of the Invention

The present invention relates to electrical and electronic circuits and systems. More specifically, the present invention relates to systems and methods for mitigating single event upset in digital circuits.

2. Description of the Related Art

Particulate radiation (such as energetic electrons, protons, or ions) in space and airborne environments can cause errors to occur in digital circuits. A single event upset (SEU) is an error that occurs when an energy particle strikes a sensitive node in the circuit and causes a logic level to change state to an opposite value. SEU is an increasing problem in space—and even critical terrestrial—applications, since evolving digital technologies are of ever-smaller features sizes, and smaller feature-sized technology is more susceptible to upset by radiation. In order to use these technologies, methods must be provided to mitigate upset.

A common approach to mitigating these upsets is to use redundancy techniques such as triple modular redundancy (TMR), in which the circuit is duplicated to provide three identical circuits, the outputs of which are then processed by a voter. The voter selects the output that is held in the majority of the circuits. Thus, if one of the three circuits is upset, the other two circuits will mask the error.

This approach works well for circuits that are clocking and updating continuously so that the probability of upsets occurring in more than one redundant circuit is low. If, however, the circuits are not being loaded frequently enough (common with some storage elements such as flip-flops), upsets may accumulate. The total number of upsets that can be mitigated is limited by the quantity of redundant information (TMR, for example, can handle only one upset). Over time, enough upsets can accumulate in the mitigated circuit to saturate the redundancy scheme, resulting in a functional error (e.g., two of the three circuits in a TMR scheme may become upset, causing the voter to select the wrong output).

The standard solution to this problem of upset accumulation is "scrubbing" the storage elements at a frequency high enough to reduce the probability of redundancy saturation to an acceptable level. Scrubbing involves periodically rewriting the correct state to each circuit. The rate at which the circuits are rewritten is chosen to be faster than upsets will accumulate (typically several times a day, depending on the application and environmental conditions). Increasing the scrubbing rate will reduce the probability of a functional error caused by redundancy saturation; however, it will also increase power consumption and consume bandwidth (since scrubbed resources are not available during scrubbing cycles). This can be problematic for power sensitive applications such as space applications.

Hence, a need exists in the art for an improved system or method for mitigating single event upset accumulation that offers lower power and bandwidth consumption than prior approaches.

SUMMARY OF THE INVENTION

The need in the art is addressed by the redundancy scrubber of the present invention. The novel scrubber includes fault detection logic for detecting if a circuit has been upset and a mechanism for automatically rewriting data to the circuit when an upset is detected. In an illustrative embodiment, the scrubber corrects for upsets in a circuit comprised of a plurality of redundant circuits, each redundant circuit including a data port for receiving data and a load enable port for controlling when the redundant circuit should load new data. A switching circuit couples either corrected data from a voter or new incoming data to the data ports of the redundant circuits depending on a load control signal. The fault detection logic processes the outputs from each of the redundant circuits and outputs a fault detect signal indicating whether an upset has been detected in one or more of the redundant circuits. The fault detect signal is coupled to the load enable ports of the redundant circuits, forcing the redundant circuits to immediately reload with corrected data from the voter or with new incoming data when an upset is detected. Optionally, the redundancy scrubber may also be configured to identify which of the redundant circuits is upset and isolate the reload to only the upset circuit.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
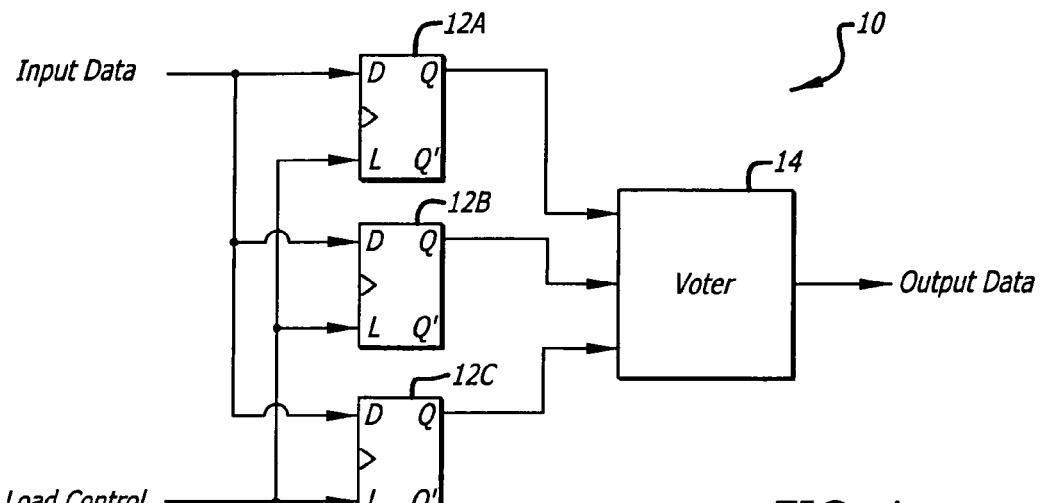
FIG. 1 is a simplified schematic of a conventional single event upset (SEU) mitigated flip-flop circuit with triple modular redundancy.

FIG. 1 is a simplified schematic of a conventional SEU mitigated flip-flop circuit 10 with triple modular redundancy. The mitigated circuit 10 includes three identical flip-flops 12A, 12B, and 12C. Input data is fed to the data input port D of each flip-flop 12A-12C, and a load control signal is fed to the load enable port D of each flip-flop 12A-12C for controlling when the flip-flops 12A-12C should load new data. The outputs Q of each flip-flop 12A-12C are processed by a voter circuit 14, which includes logic that determines the output held by the majority of the flip-flops 12A-12C.

As described above, if the flip-flops 12A-12C are not loaded frequently enough, upsets may accumulate and cause the voter 14 to make an error. For example, if an upset causes the first flip-flop 12A to change state, the flip-flop 12A will store the incorrect state until the next time it is instructed to load new data. If a second upset causes the second flip-flop 12B to also change state before the flip-flops 12A-12C are reloaded, then a majority of the flip-flops 12A and 12B will be storing and outputting the incorrect value, causing the voter 14 to output the incorrect value.

Prior solutions to this problem have included increasing the flip-flop load frequency, or periodically rewriting the flip-flops with corrected data at a rate faster than upsets accumulate. Both of these approaches, however, will increase power consumption, which may not be acceptable for certain power sensitive applications.

In accordance with the present teachings, the problem of upset accumulation is addressed by using a novel fault triggered self-scrubbing technique that detects when a circuit has been upset and then immediately forces a reload of the upset circuit with either corrected data from the voter or with fresh incoming data. Thus, instead of periodically scrubbing all of the circuits in the overall system (which may, for example, include thousands of mitigated circuits, each mitigated circuit including three or more redundant flip-flops), the present invention only scrubs the circuit that has been upset, immediately after the upset is detected. The possibility of upset accumulation is therefore eliminated almost completely, without incurring significant additional power or gate count.

Figure 2:
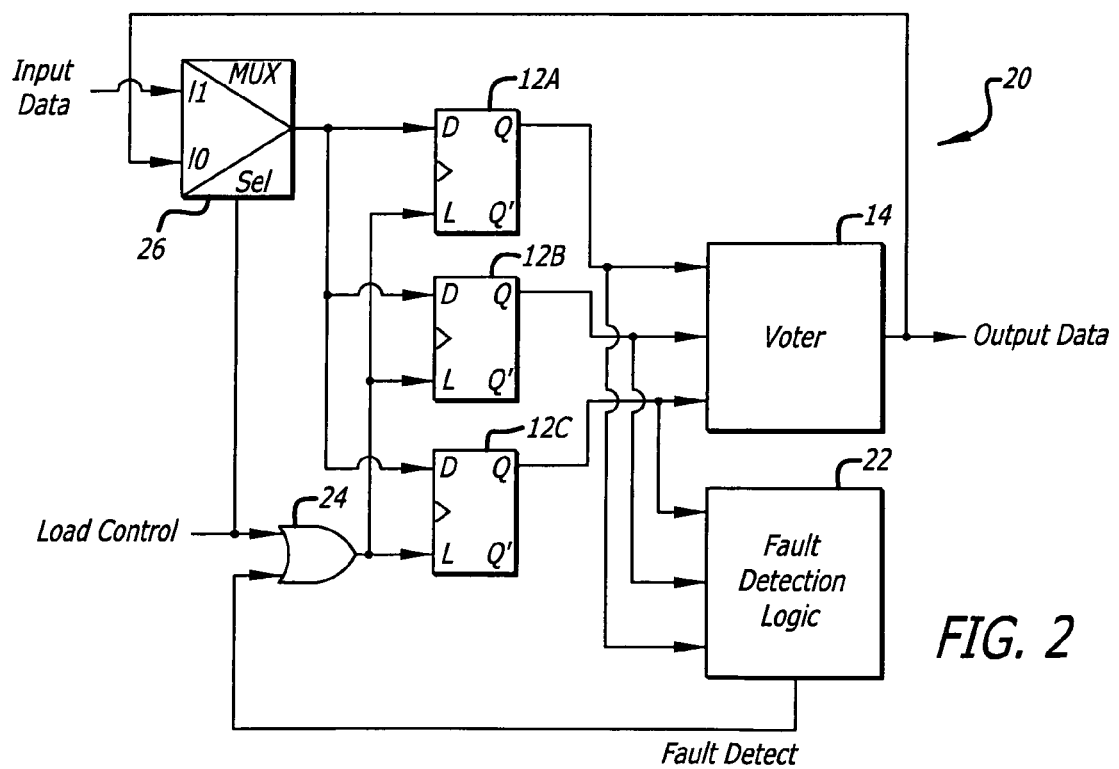
FIG. 2 is a simplified schematic of a SEU mitigated flip-flop circuit with triple modular redundancy and fault triggered self-scrubbing designed in accordance with an illustrative embodiment of the present invention.

FIG. 2 is a simplified schematic of a SEU mitigated flip-flop circuit 20 with triple modular redundancy and fault triggered self-scrubbing designed in accordance with an illustrative embodiment of the present invention. The mitigated circuit 20 includes three redundant flip-flops 12A, 12B, and 12C, whose outputs are processed by a voter 14. The mitigated circuit 20 performs the function of a single flip-flop circuit and receives an input data signal and a load control signal (for controlling when the circuit 20 should load new incoming data). The output of the voter 14 is the output of the circuit 20.

In accordance with the present teachings, the mitigated circuit 20 also includes a fault detection circuit 22 that detects when any of the redundant flip-flops 12A-12C is upset. In the illustrative embodiment, the fault detection circuit 22 includes logic that receives the outputs of the three flip-flops 12A-12C and determines if all of the outputs are the same. If they are not all the same, the fault detection circuit 22 outputs a "fault detect" signal indicating that an upset or fault has been detected. In the embodiment of FIG. 2, the fault detection circuit 22 is shown as a circuit separate from the voter 14; however, the fault detection logic 22 may also be implemented as part of the voter 14 in order to reduce gate count.

The fault detect signal generated by the fault detection circuit 22 is input to an OR gate 24, which controls the signal fed to the load enable ports L of the flip-flops 12A-12C. The inputs to the OR gate 24 are the fault detect signal and the load control signal, and the output of the OR gate 24 is coupled to the load enable port L of each flip-flop 12A-12C. Thus, if the load control signal indicates that it is time to load new incoming data, or if the fault detect signal indicates that an upset has been detected, then the flips-flops 12A-12C are instructed to load data through their data ports D.

The circuit 20 also includes a multiplexer or switch 26 for controlling if new incoming data (from the input data signal) or the current corrected state (from the output of the voter 14) is the input to the data ports D of the flip-flops 12A-12C, based on whether or not the circuit 20 is about to be loaded with fresh data (as indicated by the load control signal). The inputs to the multiplexer 26 are the input data signal and the output data signal (the output of the voter 14), and the selector port of the multiplexer 26 is coupled to the load control signal. The output of the multiplexer 26 is coupled to the data ports D of each flip-flop 12A-12C. Thus, when the load control signal indicates that it is time to load new incoming data, the multiplexer 26 feeds the input data signal to the flip-flops 12A-12C; otherwise, the multiplexer 26 feeds the output data from the voter 14 back to the flip-flops 12A-12C.

Therefore, in operation, the fault detection circuit 22 monitors the outputs of the redundant flip-flops 12A-12C and detects when an upset occurs (when the outputs of the flip-flops 12A-12C are not identical). When an upset is detected, the fault detect signal output by the fault detection circuit 22 forces an immediate reload of the flip-flops 12A-12C with either corrected data from the voter 14 or with fresh incoming data (when indicated to do so by the load control signal). Since upsets are thus corrected immediately after being detected, upsets will not accumulate and there is no need (from a SEU standpoint) for regularly scrubbing all of the circuits 20.

In the illustrative embodiment of FIG. 2, whenever a dissenting output is detected by the fault detection circuit 22, all of the redundant flip-flops 12A-12C in the mitigated circuit 20 are scrubbed. Alternatively, the circuit 20 may also be configured to determine which redundant flop-flop has been upset and to reload only the upset flip-flop.

Figure 3:
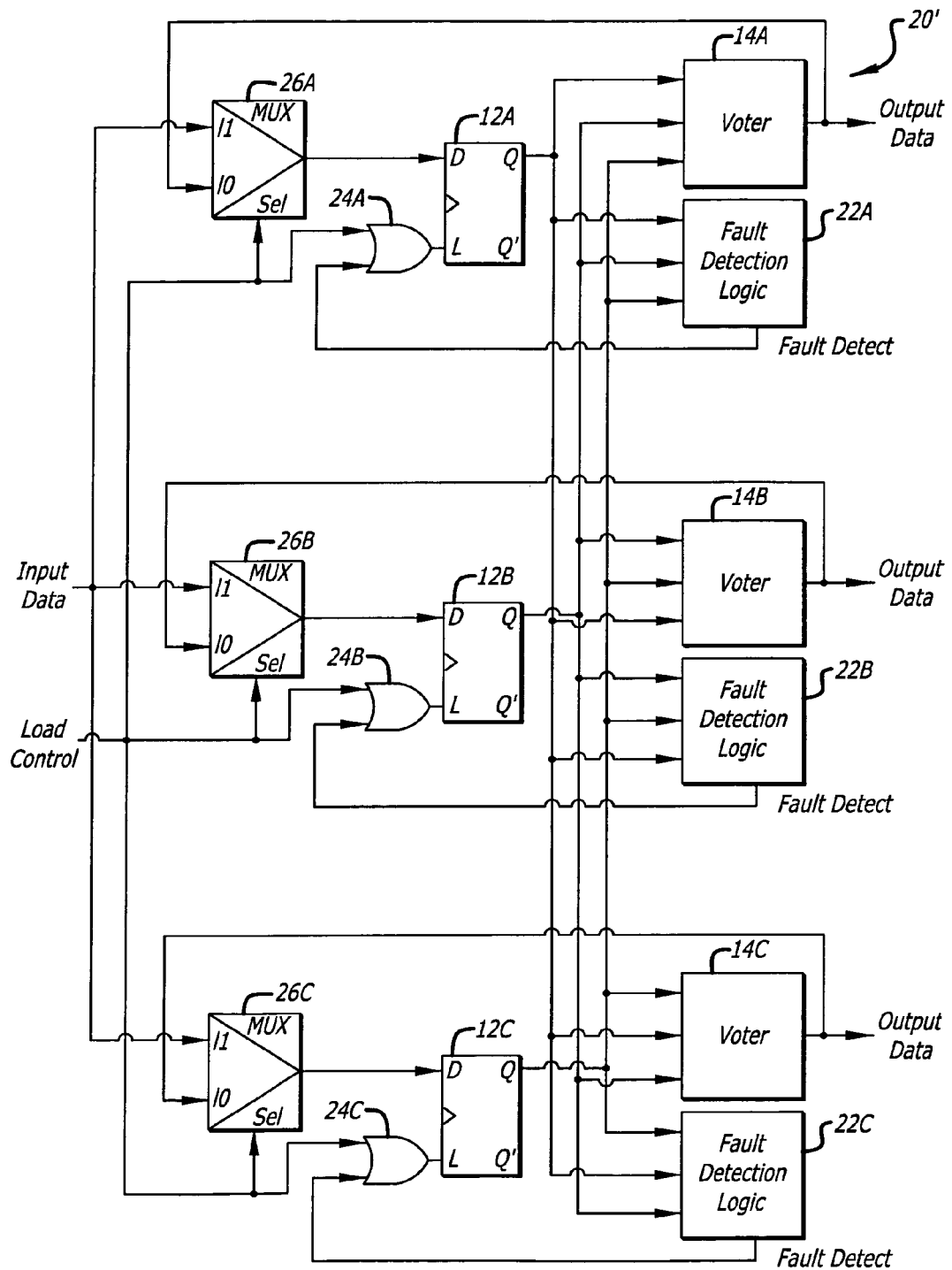
FIG. 3 is a simplified schematic of an alternate SEU mitigated flip-flop circuit with triple modular redundancy and fault triggered self-scrubbing designed in accordance with an illustrative embodiment of the present invention.

FIG. 3 is a simplified schematic of an alternate SEU mitigated flip-flop circuit 20' with triple modular redundancy and fault triggered self-scrubbing designed in accordance with an illustrative embodiment of the present invention. In this embodiment, the circuit 20' includes three redundant flip-flops 12A, 12B, and 12C as well as three redundant voters 14A, 14B, and 14C. The outputs from flip-flops 12A-12C are input to each voter 14A-14C. Each voter 14A-14C performs the same function: outputting the state held in the majority of the flip-flops 12A-12C. The output from each voter 14A, 14B, and 14C is fed back to a particular flip-flop 12A, 12B, and 12C, respectively. Adding redundant voters 14A-14C helps to protect the circuit 20' from reloading all of the flip-flops 12A-12C with an incorrect state due to an upset occurring in one voter.

In this embodiment, the circuit 20' also includes three fault detection circuits 22A, 22B, and 22C, three OR gates 24A, 24B, and 24C, and three multiplexers 26A, 26B, and 26C, each fault detection circuit, OR gate, and multiplexer associated with a different flip-flop 12A, 12B, or 12C, respectively. The inputs to the first OR gate 24A are the load control signal and the fault detect signal from the first fault detection circuit 22A, and the output of the OR gate 24A is fed to the load enable port L of the first flip-flop 12A. The inputs to the first multiplexer 26A are the input data signal and the output from the first voter 14A, the selector port of the multiplexer 26A is coupled to the load control signal, and the output of the multiplexer 26A is fed to the data port D of the first flip-flop 12A.

Similarly, the inputs to the second OR gate 24B are the load control signal and the fault detect signal from the second fault detection circuit 22B, and the output of the OR gate 24B is fed to the load enable port L of the second flip-flop 12B. The inputs to the second multiplexer 26B are the input data signal and the output from the second voter 14B, the selector port of the multiplexer 26B is coupled to the load control signal, and the output of the multiplexer 26B is fed to the data port D of the second flip-flop 12B. The inputs to the third OR gate 24C are the load control signal and the fault detect signal from the third fault detection circuit 22C, and the output of the OR gate 24C is fed to the load enable port L of the third flip-flop 12C. The inputs to the third multiplexer 26C are the input data signal and the output from the third voter 14C, the selector port of the multiplexer 26C is coupled to the load control signal, and the output of the multiplexer 26C is fed to the data port D of the third flip-flop 12C.

In one embodiment, each fault detection circuit 22A-22C includes logic that monitors the outputs of the three flip-flops 12A-12C and outputs a fault detect signal indicating when a mismatch has been detected on any of the redundant lines (i.e., if all the signals are not identical). Thus, an upset in any of the redundant flip-flops 12A-12C will force a reload of all the flip-flops 12A-12C (assuming there are no errors in the voters 14A-14C or fault detection circuits 22A-22C).

Alternatively, each fault detection circuit 22A, 22B, and 22C may be configured to detect an upset only in its particular flip-flop 12A, 12B, or 12C, respectively. For example, the fault detection circuit 22A may include logic that receives the outputs of the three flip-flops 12A-12C and determines if the output from its corresponding flip-flop 12A is different from the majority output. Each fault detection circuit 22A, 22B, or 22C may be implemented as a comparator that compares the output of its flip-flop 12A, 12B, or 12C, respectively, with the output of its voter 14A, 14B, or 14C, respectively, and outputs a fault detect signal indicating a fault when the two signals are different. Thus, with this alternate configuration, only the redundant flip-flop with the mismatched output is forced to reload (again, assuming no upsets in the voters 14A-14C or fault detection circuits 22A-22C).

Thus, in general, the present teachings addresses the problem of SEU accumulation in digital circuits with a redundancy scheme by adding a small addition or modification to the voting logic that detects when a redundant circuit has been upset (and optionally identifying which circuit is upset), determining whether or not the circuit is about to be loaded with fresh data, and then forcing an immediate reload of all the redundant flip-flops (or just the upset flip-flop) with corrected data from the voter or with fresh incoming data. By using this approach, no bandwidth is consumed by the scrubbing logic and the possibility of upset accumulation is eliminated almost completely. In addition, the flip-flop load frequency is not increased, so there is no increase in dynamic power to accomplish the scrubbing.

Thus, the present invention has been described herein with reference to a particular embodiment for a particular application. Those having ordinary skill in the art and access to the present teachings will recognize additional modifications, applications and embodiments within the scope thereof. For example, while the invention has been described with reference to a flip-flop circuit with triple modular redundancy, the present teachings may also be applied to other types of circuits and other types of redundancy schemes.

It is therefore intended by the appended claims to cover any and all such applications, modifications and embodiments within the scope of the present invention.

Accordingly,

What is claimed is:

1. A redundancy scrubber, comprising:
   first means for detecting if a circuit or a component thereof has been upset; and
   second means for automatically rewriting data to said circuit when an upset is detected,
   wherein said second means comprises a switching circuit that selectively applies said circuit with either new incoming data or with corrected data to said circuit,
   wherein said redundancy scrubber is adapted to correct for upsets in a mitigated circuit comprised of a plurality of redundant circuits,
   wherein said mitigated circuit further includes third means for processing outputs from each of said redundant circuits and outputting corrected output data corresponding to the value output by a majority of said redundant circuits,
   wherein said first means includes fault detection logic adapted to detect when one or more of said redundant circuits is upset,
   wherein said fault detection logic is adapted to receive said outputs from each of said redundant circuits and output a fault detect signal indicating whether an upset has been detected,
   wherein said fault detection logic is adapted to output a fault detect signal indicating an upset has been detected if at least one output from one of said redundant circuits is mismatched relative to the outputs from the other redundant circuits,
   wherein said second means includes means for forcing a redundant circuit to reload data when said fault detect signal indicates an upset has been detected in said redundant circuit, and
   wherein said second means further includes fourth means for determining whether said redundant circuits are about to be loaded with new data and in accordance therewith writing either said new data or said corrected output data to said redundant circuit.

2. The redundancy scrubber of claim 1, wherein said first means includes means for determining a correct state of said circuit.

3. The redundancy scrubber of claim 2, wherein said first means further includes means for comparing a state of said circuit and said correct state and outputting a control signal indicating a detected upset if said states do not match.

4. The redundancy scrubber of claim 1, wherein each of said redundant circuits includes a data port for receiving data and a load enable port for controlling when said redundant circuit should load new data.

5. The redundancy scrubber of claim 4, wherein said switching circuit comprises a multiplexer having a first input coupled to said new data, a second input coupled to said corrected output data, and an output coupled to said data port of each redundant circuit.

6. The redundancy scrubber of claim 5, wherein a selector port of said multiplexer is coupled to a load control signal.

7. The redundancy scrubber of claim 6, wherein said second means further includes fifth means for coupling either said fault detect signal or said load control signal to said load enable port of each redundant circuit.

8. The redundancy scrubber of claim 7, wherein said fifth means includes an OR gate having a first input coupled to said fault detect signal, a second input coupled to said load control signal, and an output coupled to said load enable port of each redundant circuit.

9. The redundancy scrubber of claim 1, wherein said second means includes means for forcing all redundant circuits to reload data when said fault detect signal indicates an upset has been detected in any redundant circuit.

10. The redundancy scrubber of claim 1, wherein said third means includes a voter circuit.

11. The redundancy scrubber of claim 10, wherein said third means includes a plurality of voter circuits, each voter circuit corresponding to one of said redundant circuits and each voter circuit generating a corrected output data signal.

12. The redundancy scrubber of claim 11, wherein said corrected output data signal from each voter circuit is coupled to a data port of its corresponding redundant circuit.

13. A redundancy scrubber, comprising:
   first means for detecting if a circuit or a component thereof has been upset;
   second means for automatically rewriting data to said circuit when an upset is detected,
   wherein said second means comprises a switching circuit that selectively applies said circuit with either new incoming data or with corrected data to said circuit, wherein said redundancy scrubber is adapted to correct for upsets in a mitigated circuit comprised of a plurality of redundant circuits, wherein said first means includes means for determining a correct state of said circuit, wherein said first means further includes means for comparing a state of said circuit and said correct state and outputting a control signal indicating a detected upset if said states do not match, wherein said mitigated circuit further includes third means for processing outputs from each of said redundant circuits and outputting corrected output data corresponding to the value output by a majority of said redundant circuits, wherein said first means includes fault detection logic adapted to detect when one or more of said redundant circuits is upset, wherein said fault detection logic is adapted to receive said outputs from each of said redundant circuits and output a fault detect signal indicating whether an upset has been detected, wherein said fault detection logic is adapted to output a fault detect signal indicating an upset has been detected if at least one output from one of said redundant circuits is mismatched relative to the outputs from the other redundant circuits, wherein said fault detection logic is also adapted to identify which of said redundant circuits is upset, wherein said second means includes means for forcing only said upset redundant circuit to reload data when said fault detection logic detects an upset in said upset redundant circuit.

14. The redundancy scrubber of claim 13, wherein said fault detection logic includes a plurality of fault detection circuits, each fault detection circuit corresponding to one of said redundant circuits.

15. The redundancy scrubber of claim 14, wherein each fault detection circuit is adapted to detect if its corresponding redundant circuit is upset.

16. The redundancy scrubber of claim 15, wherein each fault detection circuit is adapted to output a fault detect signal indicating an upset has been detected if said output from said corresponding redundant circuit is mismatched relative to the outputs from the other redundant circuits.

17. The redundancy scrubber of claim 16, wherein said fault detect signal from each fault detection circuit is coupled to a load enable port of its corresponding redundant circuit.

18. A single event upset mitigated circuit comprising:
a plurality of redundant circuits, each redundant circuit including a data port for receiving data and a load enable port for controlling when said redundant circuit should load new data;
a voter circuit adapted to process outputs from each of said redundant circuits and generate a corrected output data signal corresponding to the value output by a majority of said redundant circuits;
a fault detection circuit adapted to detect if one or more of said redundant circuits has been upset and output a fault detect signal indicating whether an upset has been detected;
logic for coupling said fault detect signal or a load control signal to said load enable ports of said redundant circuits; and
a switching circuit for receiving said load control signal and in accordance therewith couple either an input data signal or said corrected output data signal to said data ports of said redundant circuits.

* * * * *